United States Patent [19]

Pathak et al.

[11] 4,223,394

[45] Sep. 16, 1980

[54] SENSING AMPLIFIER FOR FLOATING GATE MEMORY DEVICES

[75] Inventors: Saroj Pathak, Campbell; George Perlegos, Cupertino, both of Calif.

[73] Assignee: Intel Corporation, Santa Clara, Calif.

[21] Appl. No.: 11,915

[22] Filed: Feb. 13, 1979

[51] Int. Cl.[3] ............................................. G11C 11/40
[52] U.S. Cl. .................................. 365/210; 307/238; 365/207; 365/189
[58] Field of Search ................ 307/238,279; 365/189, 365/190, 104, 202, 203, 207, 210, 230, 185

[56] References Cited

U.S. PATENT DOCUMENTS 4,097,753  6/1978  Cook et al. ........................... 365/210

*Primary Examiner*—Terrell W. Fears
*Attorney, Agent, or Firm*—Blakely, Sokoloff, Taylor & Zafman

[57] ABSTRACT

An MOS sensing amplifier for sensing the binary state of floating gate memory devices in a read-only memory is disclosed. The potentials on the column lines in the memory are held to a narrow voltage swing. A pair of "zero" threshold voltage transistors having slightly different threshold voltages are used to maintain the potentials on these lines. A potential developed from the column line is compared with a reference potential developed with a "dummy" biasing network and a "dummy" floating gate memory device.

15 Claims, 1 Drawing Figure

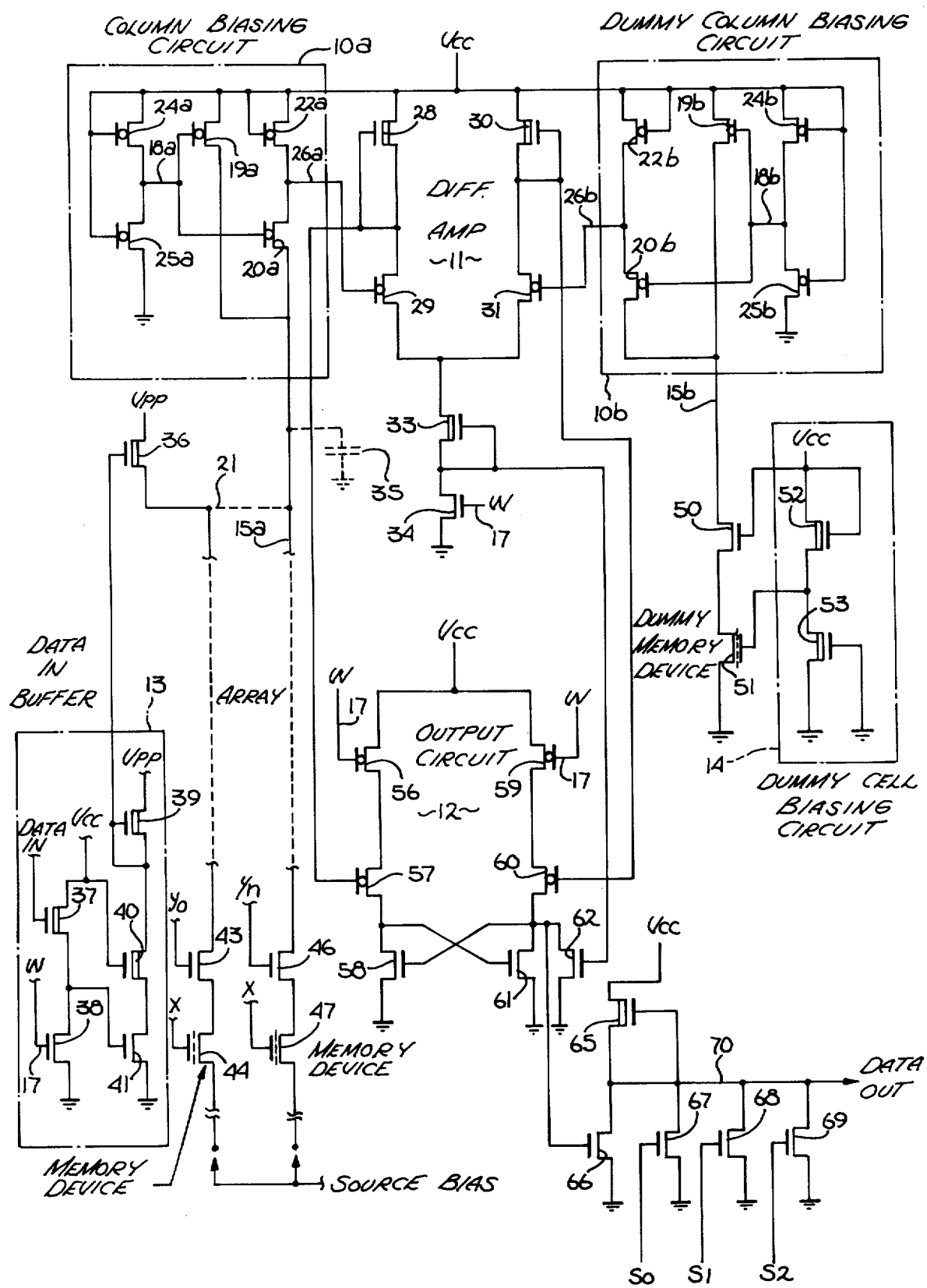

SENSING AMPLIFIER FOR FLOATING GATE MEMORY DEVICES

BACKGROUND OF THE INVENTION

1. Field of the Invention

The invention relates to the field of sensing amplifiers used in conjunction with floating gate memory devices.

2. Prior Art

In MOS read-only memories employing floating gate memory devices, it is common to selectively couple a plurality of these devices to a common sensing amplifier through a column line in the memory array. Typically, the column line is charged; the line is discharged when coupled to a conductive memory device or remains charged if the device is nonconductive. The charge or potential on the line is sensed to determine the binary state (conductive or nonconductive) of the memory device. One such sensing amplifier is disclosed in U.S. Pat. No. 4,094,012, FIG. 3.

The column line when coupled to a conductive device is often allowed to substantially discharge. Before another read cycle, this line must again be recharged. This recharging period reduces the access time in these memories since there is generally considerable parasitic capacitance associated with these lines. This problem is obviously aggravated in larger memories because the column lines have more capacitance.

With the present invention, the potential on the column line is held to a relatively small voltage swing (approximately 0.1 volts), thus considerably less time is required to recharge the column line. A unique biasing circuit and the generation of a reference potential using a "dummy" memory device allows accurate detection despite this small voltage swing.

SUMMARY OF THE INVENTION

An amplifier for sensing the binary state of a first MOS floating gate device is described. The device is coupled to a first biasing means through a line such as a column line. The first biasing means charges the line to a first potential when the device is in one binary state and prevents the line from dropping below a second potential when the device is in its other binary state. A second floating gate memory device, substantially identical to the first device, is used to provide a reference load. The second device is biased at a predetermined level. A second biasing means coupled to the second device provides a reference potential. A comparator means compares a potential developed from the potential on the line with the reference potential to detect the binary state of the first device. In this manner, the binary states of the first device may be sensed, and moreover, the amplifier is quickly able to again sense the state of the first device since the line is prevented from discharging by the first biasing means.

BRIEF DESCRIPTION OF THE DRAWING

The drawing is an electrical schematic illustrating the presently preferred embodiment of the invented sensing amplifier.

DETAILED DESCRIPTION OF THE INVENTION

A sensing amplifier for sensing the binary states of MOS floating gate memory devices is disclosed. In the following description numerous specific details such as specific device sizes and threshold voltages are set forth to provide a thorough understanding of the present invention. However, it will be obvious to one skilled in the art that the invention may be practiced without these specific details.

In its presently preferred embodiment, the invented sensing amplifier is incorporated into an integrated circuit, read-only memory fabricated employing metal-oxide-semiconductor (MOS) technology. The amplifier is realized in a 64K memory having 256 column lines and 256 row lines. The field-effect transistors employed in the memory are n-channel devices having polycrystalline silicon gates. Other aspects of the memory are disclosed in copending application Ser. No. 963,973 filed Nov. 27, 1978 and entitled "MOS STATIC DECODING CIRCUIT." This copending application is assigned to the assignee of the present application.

The particular floating gate memory devices employed in the present invention, shown as devices 44 and 47 of the FIGURE, include a pair of n-type regions formed in the substrate, a floating gate disposed above the channel and a control gate disposed above the floating gate. These devices have a threshold voltage of approximately 3.5 volts or greater when the floating gate is charged (negatively charged) and a threshold voltage of approximately 1.5 volts when the floating gate is discharged or uncharged. The presently preferred embodiment of these floating gate devices is generally described in U.S. Pat. No. 4,114,255.

The specific process used to fabricate the memory, including the invented sensing amplifier, results in four different transistor-types; each of which has a different threshold voltage. This process, which is disclosed in U.S. Pat. No. 4,052,229, employs a high resistivity p-type silicon substrate (50 ohm-cm), resulting in high mobility devices with low body effect.

One transistor type employed in the memory is an enhancement mode transistor having a threshold voltage of approximately +0.6 to +0.9 volts. This transistor is illustrated in the FIGURE by the standard field-effect symbol, such as shown for transistors 58 and 61. The second transistor type employed in the memory is a depletion mode transistor having a threshold voltage of approximately −2.5 to −3.5 volts. The symbol designation used in the FIGURE for this type of transistor is shown by transistors 28 and 30. The third transistor type which results from this process is a "weak" depletion mode device having a threshold voltage between −1.2 volts to −1.8 volts; this device is not employed in the present invention. The last transistor type has a threshold voltage approximately equal to zero volts. In typical fabrication, the threshold voltage of these devices ranges between −0.30 to +0.20 volts. This device is referred to in this application as a "zero" threshold transistor or device since its threshold voltage is approximately zero volts. The symbol employed for this device includes a small zero under the gate such as shown in the FIGURE by devices 29 and 31.

In the presently preferred embodiment, the channel regions of the zero threshold devices employ the substrate without any further doping. However, threshold variations of these zero threshold devices are intentionally made by varying the width of the channel regions as will be described in greater detail in conjunction with the transistors 19a and 19b and transistors 20a and 20b. In contrast, the channel regions for the depletion mode transistors are arsenic implanted to a dopant level of approximately $0.8 \times 10^{12}/cm^2$. The threshold voltage for the enhancement mode transistor is obtained by employing a boron dopant in the channel regions of these transistors; a dopant level of approximately $0.4 \times 10^{12}/cm^2$ is used.

Referring to the FIGURE, a typical column line in a read-only memory array is shown as line 15a. The large parasitic capacitance generally associated with such lines is shown in dotted lines as capacitor 35. The line 15a (and equivalent lines) are selectively coupled to a plurality of memory devices through field-effect transistors. Two such memory devices 44 and 47 are illustrated which are selected through the enhancement mode transistors 43 and 46, respectively.

In general, the invented sensing amplifier includes a column biasing circuit 10a which biases the column line 15a. A reference potential is developed with use of a memory device substantially identical to the memory devices 44 and 47 shown as dummy memory device 51. This device, which is biased by circuit 14, provides a load to simulate a memory device in the memory array. Line 15b couples this device to a column biasing circuit 10b which is identical to the circuit 10a. The reference potential is compared with a potential developed from line 15a in a comparator means which, in the presently preferred embodiment, is a differential amplifier 11. This amplifier is coupled to an output circuit 12 to provide a data-out signal on line 70.

Also illustrated in the FIGURE is a data-in buffer 13 which is activated when the cells in the array are programmed.

The circuit shown in the FIGURE is powered by a positive potential of approximately 5 volts identified as $V_{cc}$. During the programming mode, a potential of approximately 25 volts is employed; this potential is shown as $V_{pp}$. When sensing occurs, a signal "W" is applied to line 17, particularly to activate the differential amplifier 11 and output circuit 12. This signal is used to prevent unnecessary power dissipation during standby modes.

In the currently realized array, eight column lines such as line 15a are coupled to each of the 32 sensing amplifiers in the memory. These additional lines are illustrated by the broken line 21. As is typically the practice, a plurality of memory devices, each of which includes a selection transistor such as transistor 46, are selectively coupled to these column lines with signals from the X and Y decoders shown in the FIGURE as signals $Y_0-Y_n$ and X. In the currently realized array, there are eight data-out lines such as line 70 with four sensing amplifiers coupled to each of these lines. Four signals ($S_0$, $S_1$, $S_2$ and $S_3$) are used to allow only one sensing amplifier at a time to be coupled to each data-out line. These signals are developed in a well-known manner from the address signals applied to the array. The sensing amplifier shown in the FIGURE is activated when the signals $S_0$, $S_1$ and $S_2$ are low, since otherwise line 70 is coupled to ground, preventing an output from the sensing amplifier illustrated in the FIGURE.

Referring now to the column biasing circuit 10a, this circuit includes a zero threshold transistor 22a employed to charge or pull-up node 26a to the potential $V_{cc}$. Node 26a is coupled to line 15a through another zero threshold transistor 20a. The line 15a is coupled to the potential $V_{cc}$ through zero threshold transistor 19a. The gates of transistors 19a and 20a are coupled to node 18a. The transistors 24a and 25a are used as a voltage dividing network to provide a predetermined biasing potential of approximately 2 volts to node 18a to bias transistors 19a and 20a at the same potential. This biasing potential on node 18a is substantially independent of $V_{cc}$ changes.

The width-length ratios of the channels of transistors 19a and 20a are 112/9 and 190.5/7, respectively. The narrower channel of transistor 20a assures a difference in threshold voltages between transistors 19a and 20a. In the presently employed process, a difference in threshold voltages of approximately 0.1 volts results. Thus, by way of example, transistor 19a has a threshold voltage of 0.2 volts while transistor 20a has a threshold voltage of 0.1 volts. It should be noted that while the threshold values of these transistors may vary from chip-to-chip and wafer-to-wafer due to expected process variations, the difference in thresholds between transistors 19a and 20a remains approximately 0.1 volts.

Assume for purposes of explanation that memory device 47 has been selected, thus transistor 46 is conductive. Assume further that the floating gate of this device is negatively charged and thus device 47 is non-conductive, that is, its threshold voltage is greater than 3.5 volts. For this condition, since there is no conduction, transistor 20a is off and transistor 22a, which is a relatively larger transistor, pulls node 26a to $V_{cc}$. Since the threshold voltage of transistor 20a is approximately zero volts and its gate is biased at approximately 2 volts, line 15a is held at 2 volts.

Assume now that the floating gate of device 47 is not charged and thus this device conducts. The conduction of this device draws current through the transistors 22a and 20a. However, as soon as the column line 15a drops 0.1 volts, transistor 19a begins to conduct, since the threshold voltage of transistor 19a is approximately 0.1 volts greater than the threshold voltage of transistor 20a. The conduction of transistor 19a provides additional current to the line 15a and prevents this line from any further drops in potential. Thus, the total voltage swing on line 15a is only approximately 0.1 volts while the voltage on node 26a varies between $V_{cc}$ (5 volts) and 2 volts.

Note that the small voltage swing on the column lines reduces the time required to recharge these lines. This, as mentioned, decreases the memory access time. Moreover, the voltage on the column lines never exceeds approximately 2 volts. With this low potential slow (unwanted) programming of the memory devices is avoided. (If the control gate of a floating gate memory device is held at $V_{cc}$ [especially for a high $V_{cc}$] for long periods of time, electrons from the channel region tend to slowly collect on the floating gate, thereby changing the stored data.)

To sense the voltage swing on node 26a, this potential is compared with a carefully developed reference potential. This reference potential is developed by the dummy column biasing circuit 10b and the dummy memory device 51.

As mentioned, the dummy memory device 51 is identical to the memory devices employed in the array. The floating gate of this device is not charged. The control gate of device 51 is biased through the depletion mode transistors 52 and 53 to approximately 2 volts below the potential applied to the control gates of the memory devices in the array. These transistors cause device 51 to conduct; however, the biasing provided by these transistors prevents this device from conducting as much as other memory devices in the array which have their control gate coupled to the X-decoders. The output of the X-decoders is close to the $V_{cc}$ potential. The biasing potential applied to the control gate of device 51 rises and falls with variations in $V_{cc}$. Thus, for example, if $V_{cc}$ rises and a higher potential is applied to the control gates of the memory devices in the array, a higher potential is also applied to the control gate of device 51.

The device 51 is coupled through a transistor 50 which is substantially identical to the transistors 43 or 46, and line 15b to the biasing circuit 10b. The biasing circuit 10b is identical to the circuit 10a; like transistors have been designated with the same number, however with the letter "b". Thus, not only is a memory device employed to provide a reference load, but also the biasing circuit used to bias this device is identical to the circuits used to bias the column lines in the array.

Since device 51 does not conduct as much as conductive memory devices in the array, the potential on node 26b is between the potential swing that occurs on node 26a. That is, node 26b is at a potential less than $V_{cc}$ and greater than 2 volts.

The differential amplifier 11 compares the potential on nodes 26a and 26b and provides signals to the output circuit 12. The differential amplifier 11 comprises transistors 28 and 29, coupled in series between $V_{cc}$ and the drain of transistor 33. The other leg of this amplifier comprises transistors 30 and 31, also coupled between $V_{cc}$ and the drain of transistor 33. Transistor 33 is coupled to ground through the enhancement mode transistor 34. It is apparent that the differential amplifier 11 is not activated until the W signal is applied to the gate of transistor 34. Thus, no power is consumed in this amplifier until this signal is present. Note that until the source and gate of transistor 33 are effectively coupled to ground through transistor 34, these terminals rise in potential, causing the transistor 62 to conduct. This, in turn, prevents an output from the output circuit 12.

In some cases the threshold voltage of the memory devices with charged floating gates is close to 3.5 volts and these devices are slightly conductive. In prior art memories, these slightly conductive devices caused considerable problems. With the above-described sensing circuit, these slightly conductive devices cause node 26a to drop below $V_{cc}$. However, node 26a does not drop below node 26b since device 51 conducts more than these slightly conductive devices. Therefore, proper sensing occurs even with memory devices having marginal threshold voltages.

The output circuit 12 is a bistable circuit which includes zero threshold transistors 56 and 57 coupled in series with the enhancement mode transistor 58. The other leg of this circuit includes the zero threshold transistors 59 and 60 coupled in series with the enhancement mode transistor 61. The gates and drain terminals of transistors 58 and 61 are cross-coupled to form the bistable circuit. Input signals to the circuit are received on the gates of transistors 57 and 60. Transistors 56 and 59 act as loads for this bistable circuit. No conduction in this circuit occurs until the W signal is applied to the gates of transistors 56 and 59.

The differential amplifier senses the difference between the reference potential on line 26b and the potential on line 26a. If the potential on line 26a is higher than the reference potential, more conduction occurs through transistors 28 and 29 than through the transistors 30 and 31. This causes a higher potential to be applied to the gate of transistor 60 than is applied to the gate of transistor 57. The higher potential on the gate of transistor 60 causes more current to flow through transistors 59 and 60, thereby raising the potential on the gate of transistor 58. This sets the bistable output circuit 12 such that transistor 58 conducts while transistor 61 is off. Conversely, if the potential on node 26a is lower than the potential on node 26b, the bistable output circuit 12 is set such that transistor 58 is off while transistor 61 conducts. The output is sensed at the drain of transistor 61 which is coupled to the gate of the transistor 66. Line 70 is coupled to $V_{cc}$ through the depletion mode transistor 65 and also to ground through transistors 67, 68 and 69. As mentioned, the transistors 67, 68 and 69 are used as part of the decoding scheme and these transistors do not conduct when an output is sensed on the line 70. The output signal from the output circuit 12 is thus coupled to the data-out line 70.

During programming, the data-in buffer 13 is activated and the source terminals of the memory devices are biased to approximately +1 volts. This biasing potential permits these devices to be more easily programmed. The data-in buffer includes the enhancement mode transistors 37 and 38 coupled in series between $V_{cc}$ and ground. The common junction between these transistors is coupled to the gate of the transistor 41. Transistor 41 is coupled to the $V_{pp}$ potential through transistors 39 and 40. The transistor 36 is used to selectively charge the column lines to the $V_{pp}$ potential.

During programming, the binary bit to be programmed is coupled through the transistor 37 to the gate of transistor 41. If a binary one is applied, transistor 41 conducts, preventing transistor 36 from charging the column lines. On the other hand, if a binary zero is applied to the gate of transistor 37, the column lines in the array are allowed to be charged with the potential $V_{pp}$. In this manner, the selected transistor may be programmed with either a binary one or binary zero.

Thus, with the described sensing amplifier, the column lines in the array are prevented from substantially discharging even when coupled to a conductive memory device. In this manner, after the sensing of the state of charge of a memory device, the line may be quickly recharged to permit another read cycle.

We claim:

1. An amplifier for sensing the binary state of a first MOS floating gate memory device comprising:
    a line coupled to said first device;
    a first biasing means coupled to said line for charging said line to a first potential when said first device is in one binary state and for preventing said line from dropping below a second potential when said first device is in its other binary state;
    a second floating gate memory device substantially identical to said first device for providing a reference load;
    a biasing circuit coupled to said second device for biasing said second device at a predetermined level;
    a second biasing means coupled to said second device for providing a reference potential;
    comparator means for comparing potentials, said comparator means coupled to said line and coupled to receive said reference potential;
    whereby said amplifier senses said binary state of said first device and is quickly able to again sense the binary state of said first device since said line is prevented from discharging by said first biasing means.

2. The amplifier defined by claim 1 wherein said first and second biasing means are substantially identical circuits.

3. The amplifier defined by claim 1 wherein said first biasing means includes a first and a second transistor coupled to said line, said transistors having a difference in threshold voltages equal to the difference between said first and second potentials.

4. The amplifier defined by claim 3 wherein said first and second transistors are devices having threshold voltages close to zero volts.

5. The amplifier defined by claim 4 wherein said second biasing means is substantially identical to said first biasing means.

6. The amplifier defined by claim 5 wherein said comparator means is a differential amplifier.

7. In a read-only memory which includes a plurality of floating gate memory devices which are selectively coupled to a line in said memory, a sensing amplifier coupled to said line for detecting the binary state of said memory devices comprising:
- a first biasing means coupled to said line for charging said line to a first potential when a selected one of said memory devices is in one binary state and for preventing said line from dropping below a second potential when said selected one of said memory devices is in its other binary state;
- an additional floating gate device substantially identical to said memory devices for providing a reference load;
- a biasing circuit coupled to the control gate of said additional device for biasing said additional device such that said additional device conducts;
- a second biasing means substantially identical to said first biasing means for providing a reference potential, said second biasing means coupled to said additional device;
- comparator means for comparing two potentials, said comparator means coupled to said line and coupled to receive said reference potential;
- whereby said amplifier quickly senses said binary states of said devices since said line is prevented from discharging.

8. The amplifier defined by claim 7 wherein said first biasing means comprises:
- a first transistor coupled to a source of potential;
- a second transistor coupled between said first transistor and said line;
- a third transistor coupled between said source of potential and said line.

9. The amplifier defined by claim 8 wherein said second and third transistors have different threshold voltages.

10. The amplifier defined by claim 9 wherein the differences in said threshold voltages of said second and third transistors is equal to the difference between said first and second potentials.

11. The amplfier defined by claim 10 wherein the gates of said second and third transistors are coupled to a common biasing means.

12. The amplifier defined by claim 11 wherein said second and third transistors have threshold voltages close to zero volts.

13. The amplifier defined by claim 12 wherein said difference in said threshold voltages is in the order of magnitude of 0.1 volts.

14. The amplifier defined by claim 13 wherein said comparator means is a differential amplifier.

15. The amplifier defined by claim 13 wherein said second biasing means is coupled to said additional device through a fourth transistor, said fourth transistor being identical to transistors employed in said memory for said selective coupling of said memory devices to said line.

* * * * *